(12) United States Patent
Pu et al.

(10) Patent No.: US 6,593,662 B1
(45) Date of Patent: Jul. 15, 2003

(54) STACKED-DIE PACKAGE STRUCTURE

(75) Inventors: Han-Ping Pu, Taichung (TW); Randy H. Y. Lo, Taichung Hsien (TW); Tzong-Dar Her, Taichung (TW); Chien-Ping Huang, Hsinchu Hsien (TW); Cheng-Shiu Hsiao, Nantou (TW); Chi-Chuan Wu, Taichung (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 163 days.

(21) Appl. No.: 09/631,343

(22) Filed: Aug. 2, 2000

(51) Int. Cl.⁷ .................. H01L 23/48; H01L 23/52; H01L 29/40
(52) U.S. Cl. .......... 257/777; 257/668; 257/676; 257/686; 257/723; 257/784
(58) Field of Search .................. 257/777, 685, 257/668, 676, 686, 723, 784, 787; 361/704, 770

(56) References Cited

U.S. PATENT DOCUMENTS 5,323,060 A * 6/1994 Fogal et al. ............... 257/777
5,719,745 A * 2/1998 Agonafer et al. .......... 361/704
5,910,682 A * 6/1999 Song ......................... 257/685
6,005,778 A * 12/1999 Spielberger et al. ....... 361/770
6,215,193 B1 * 4/2001 Tao et al. ................... 257/777
6,297,547 B1 * 10/2001 Akram ...................... 257/676
6,472,758 B1 * 10/2002 Glenn et al. ............... 257/777

* cited by examiner

Primary Examiner—David Nelms
Assistant Examiner—Mai-Huong Tran
(74) Attorney, Agent, or Firm—J.C. Patents

(57) ABSTRACT

A stacked-die package structure comprises a carrier, dies, spacers, adhesive layers, conductive lines, a mold compound, and solder balls. The carrier has an upper surface and a back surface opposite to the upper surface. The dies substantially having the same sizes are stacked one by one on the upper surface of the carrier, and a number of bonding pads are located around each die. The spacers are located between two adjacent dies. Adhesive layers located between the spacers, the dies, and the carrier for adhering layers therebetween. The conducting lines are respectively electrically connected between each of the bonding pads of the dies and the carrier. And the mold compound is formed over the upper surface of the carrier, for encapsulating the spacers, the dies and the adhesive layers. A substrate with solder balls or a lead frame having pins is suitable for serving as the carrier.

26 Claims, 6 Drawing Sheets

STACKED-DIE PACKAGE STRUCTURE

BACKGROUND OF THE INVENTION

1. Field of Invention

The present invention relates to a stacked-die package structure. More particularly, the present invention relates to a stacked-die package with a ball grid array (BGA) structure.

2. Description of Related Art

Integrated circuits (ICs) significantly influence on every aspect of human's life and have a variety of applications for various fields. In modern era, all products trend towards more small and light for convenient purposes. Accordingly, the ICs also become smaller than ever. Current semiconductor technology is heading towards a 0.18-micron process. For the IC products, three stages are usually required: fabricating silicon wafers, manufacturing IC circuits and packaging the IC dies. Namely, the package is the finally stage for completing the IC products. The package can be provided as a medium for electrically connecting between dies in the package and the printed circuit board (PCB), or between the dies and other elements. In addition, the package can protect the dies therein from damage as well.

FIG. 1 shows a conventional structure of a stacked-die package. Generally, a ball grid array (BGA) structure is usually used for a stacked-die structure. For example, similar memory dies can be packed within one package for increase memory capacity. As shown in FIG. 1, a first die 106 is attached to a substrate 102 first, and then a second die 108 is stacked on the first die 106. Adhesive layers 104 are formed between the substrate 102 and the first die 106, and between the first die 106 and the second die 108. Then, a wire bonding process is performed for electrically connecting the first die 106 to the substrate 102 using conductive lines 110a, and for electrically connecting the second die 108 to the substrate 102 using conductive lines 110b. A mold compound 114 is formed over the substrate 102 to encapsulate the substrate 102, the dies 106, 108, and the conductive lines 110a, 110b. Finally, solder balls 112 are assembled to the back surface of the substrate 102.

However, the structure above requires that the first die 106 must larger than the second die 108, or that a width difference for each side of the two dies 106, 108 must be greater than 0.3 mm. If the two dies 106, 108 have the same sizes, the wire bonding process will fail, or the second die will short the conductive lines 110a.

FIG. 2 shows a top view of a conventional stacked-die structure. A first die 806 is sat on a substrate 802, and a second die 808 is then stacked on the first die 806, in which the first die 806 and the second die 808 are perpendicular to each other. There are several bonding pads on the two sides of each die 806, 808. For preventing crack or collapse of the second die 808 during wire bonding, spacers 840 are formed under two other sides of the second die 808 for shoring the second die 808. However, the conventional stacked-die structure is not suitable for dies having bonding pads located on their four peripheral sides.

FIG. 3 shows a conventional structure of a stacked-die package using a lead frame as a carrier. The structure shown in FIG. 3 is issued to U.S. Pat. No. 5,291,061. A first die 906 and a second die 908 have almost the same sizes. The first die 906 is affixed to the lead frame 902, and conductive lines 910a are electrically connected the first die 906 to the lead frame 902. A polyimide tape 930 is attached on the first die 906, and then the second die 908 is stacked on the polyimide tape 930. Conductive lines 910b are then electrically connected the second die 908 to the lead frame 902. Finally, a mold compound 914 is used for encapsulating the first and second dies 906, 908, the conductive lines 910a, 910b and the lead frame 902, while pins 932 of the lead frame 902 are exposed. In the prior art structure, the polyimide tape 930 costs high and its thermal conductivity is bad, causing that the second die 908 is not easily to dissipate heat. Furthermore, it requires special tapping machine for taping the polyimide tape 930 between the dies 906, 908 under a high temperature condition above 400° C., thus increasing cost. In addition, the polyimide tape causes the cushion effect on the second die 908, affecting the quality and reliability of wire bonding for the second die 908.

SUMMARY OF THE INVENTION

The present invention provides a stacked-die package structure capable of stacking dies having substantially the same size and bonding pads around the peripheral sides of the dies within one package.

The present invention provides a stacked-die package structure for reducing the cushion effect, which usually occurs in the conventional stacked-die structure.

The present invention provides a stacked-die package structure capable of increasing efficiency of heat dissipation.

The present invention provides a stacked-die package structure for reducing cost and simplifying manufacturing process.

As embodied and broadly described herein, the invention provides a stacked-die package structure. A carrier having an upper surface and a back surface opposite to the upper surface is provided. A number of dies are stacked one by one on the upper surface of the carrier, and a number of bonding pads formed around the peripheral sides of each die. A number of spacers are located between two adjacent dies. Adhesive layers are located between the spacers, the dies, and the carrier for adhering layers therebetween. Conducting lines are used for respectively electrically connecting each of the bonding pads of the dies and the carrier. And, a mold compound is formed over the upper surface of the carrier, for encapsulating the spacers, the dies and the adhesive layers.

The invention also provides a stacked-die package structure. A carrier having an upper surface and a back surface opposite to the upper surface is provided. A number of dies are stacked one by one on the upper surface of the carrier, and a number of bonding pads are formed around the peripheral sides of each die. Spacers are located between two adjacent dies, and one of the spacers, which is located on a top of the stacked dies, has a thermal dissipation surface. Adhesive layers are located between the spacers, the dies, and the carrier for adhering layers therebetween. Conducting lines are used for respectively electrically connecting each of the bonding pads of the dies and the carrier. And a mold compound is formed over the upper surface of the carrier, for encapsulating the spacers, the dies and the adhesive layers, but the heat dissipation surface is exposed.

The invention further provides a stacked-die package structure. A carrier having an upper surface and a back surface opposite to the upper surface is provided. A number of dies are stacked one by one on the upper surface of the carrier, and a number of bonding pads are located around the peripheral sides of each die. A thermal dissipation plate is stacked on the dies, having at least one thermal dissipation surface. A number of spacers are located between two adjacent dies, and between the dies and the thermal dissipation plate. Adhesive layers are located between the spacers, the dies, the thermal dissipation plate and the carrier for adhering layers therebetween. Conducting lines are used for respectively electrically connecting each of the bonding pads of the dies and the carrier. And, a mold compound is formed over the upper surface of the carrier, for encapsulating the spacers, the dies and the adhesive layers, but the heat dissipation surface of thermal dissipation plate is exposed.

Advantageously, the material of the adhesive layers can be silver paste, or paste with thermal conductivity and non-electrical conductivity, such that the adhesive process is not necessary to be performed under a high temperature above 400° C., simplifying the manufacturing process and avoiding crack or collapse of the first and the second dies during the adhesive process under high temperature. It can also avoid cushion effect due to the insufficient rigidity of the second die when the wire bonding process for the conductive lines is performed using supersonic, and therefore increases the yields. Moreover, the material of the spacers has good thermal conductivity and its thermal expansion coefficient is approximate to that of the dies so that the thermal stress is reduced. By exposing the surface of the spacer or adding a thermal dissipation plate for increasing heat dissipation surface, the thermal dissipation efficiency further increases.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
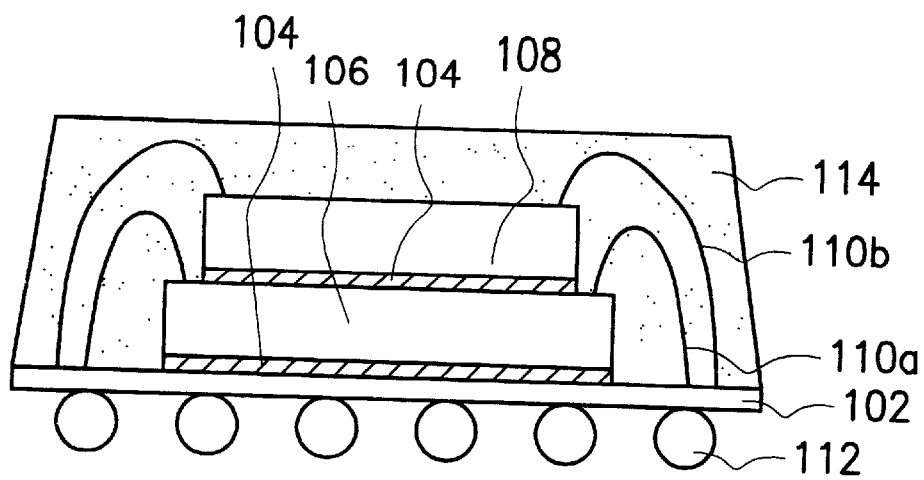
FIG. 1 shows a conventional structure of a stacked-die package.
Figure 2:
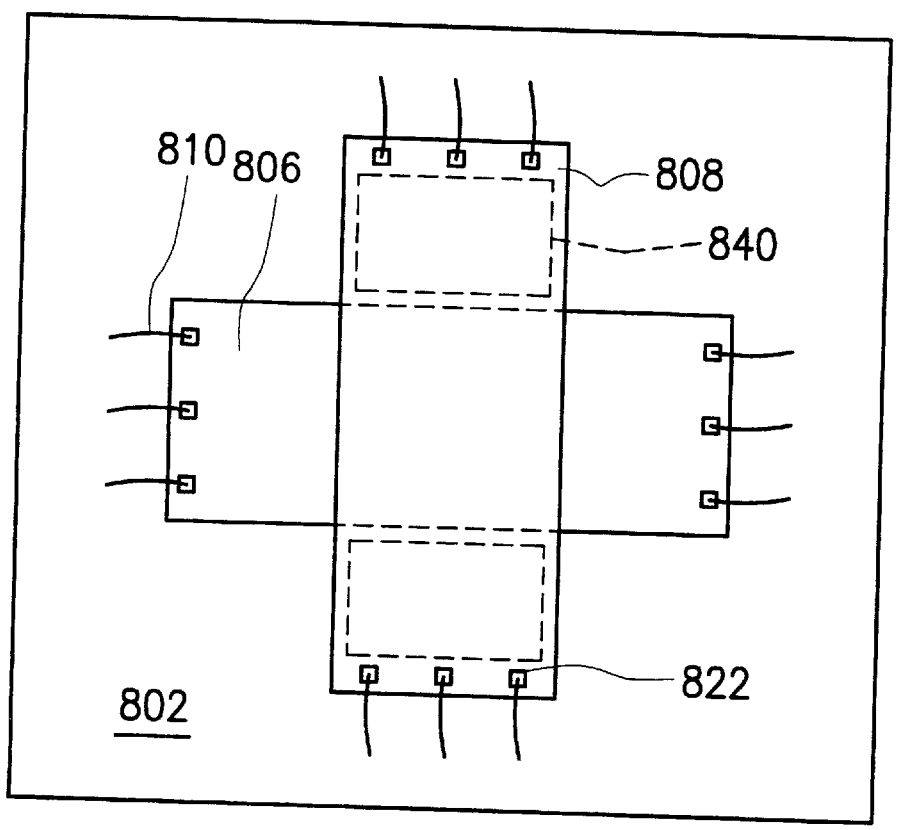
FIG. 2 shows a top view of a conventional stacked-die structure.
Figure 3:
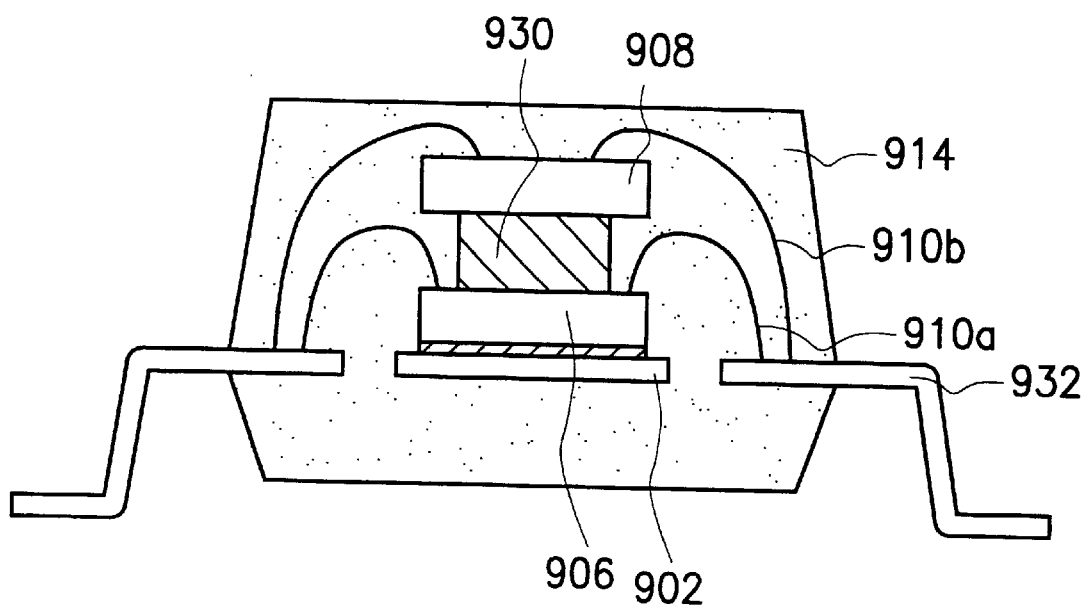
FIG. 3 shows a conventional structure of a stacked-die package using a lead frame as a carrier.
Figure 4A:
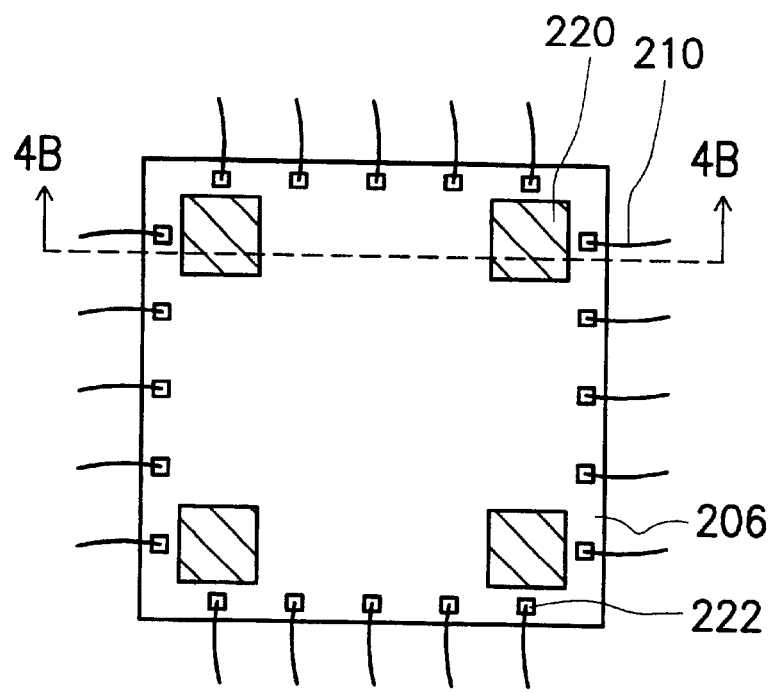
FIGS. 4A and 4B respectively show a top view and a cross-sectional view of a stacked-die package structure according to the first embodiment of the present invention.
Figure 4B:
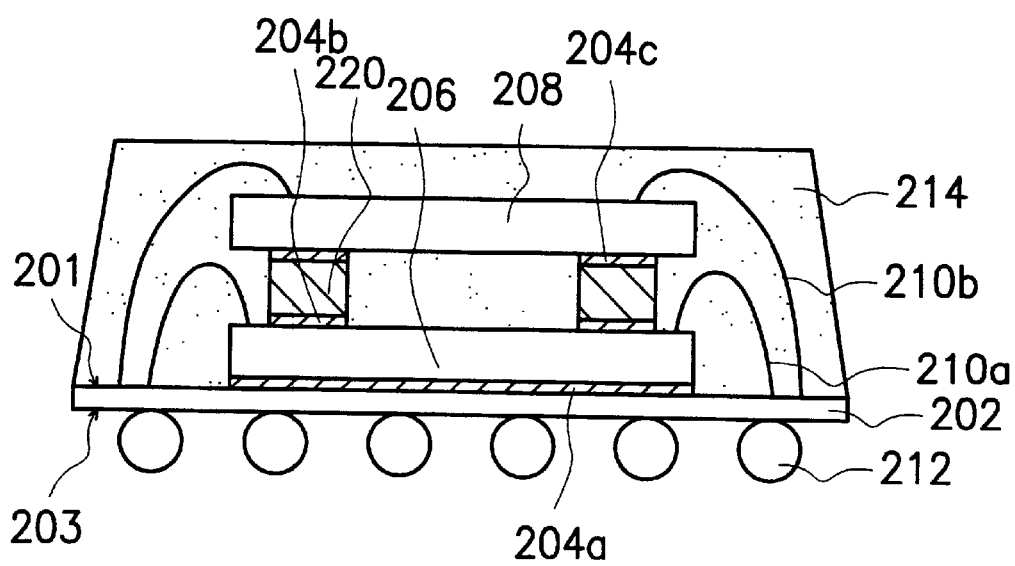

FIG. 4A schematically shows a top view of a stacked-die package structure according to the first embodiment of the present invention. FIG. 4B schematically shows a cross-sectional view of FIG. 4 along the line 4B—4B.

As shown in FIGS. 4A and 4B, a carrier 202 has an upper surface 201 and a back surface 203 opposite to the upper surface 201. The carrier 202 can be a substrate with solder balls 212 formed on the back surface 203, or a lead frame with pins (not shown). A number of dies are stacked one by one on the carrier 202. In the first embodiment, a first and a second dies 206, 208 are used as a descriptive example. The sizes of the first and the second dies 206, 208 are approximate or the same. There are bonding pads 222 located around the peripheral sides of the first and the second dies 206, 208 respectively. The first die 206 is sat on the upper surface 201 with an adhesive layer 204a. The conducting lines 210a are respectively used for electrically connecting between the bonding pads 222 of the first die 206 and the carrier 202. Spacers 220 are stacked on the first die 206 with adhesive layers 204b, and the second die 208 is then stacked on the spacers 220 with adhesive layers 204c. The conducting lines 210b are respectively used for electrically connecting between the bonding pads of the second die 208 and the carrier 202.

The spacers 220 can be made in a column shape for reducing material cost and used for elevating the second die 208 such that a height existed between the first and the second dies 206, 208. The adhesive layers 204a, 204b and 204c are used for adhering the carrier 202, the first die 206, the spacers 220 and the second die 208 therebetween. The material of the adhesive layer 204a/204b/204c can be silver paste, or paste with thermal conductivity and non-electrical conductivity. Therefore, the adhesive process is not necessary to be performed under a temperature above 400° C., simplifying the manufacturing process and avoiding crack of the first and the second dies 206, 208 during the adhesive process under high temperature. In addition, it can also avoid cushion effect due to the insufficient rigidity of the second die 208 when the wire bonding process for the conductive lines 210a, 210b is performed using supersonic, and therefore increases the yields.

A mold compound 214 is formed over the upper surface 201 of the carrier 202 to encapsulate the spacers 220, the first and second dies 206, 208, and the adhesive layers 204a, 204b and 204c. The material of the mold compound 214 can be epoxy. If the carrier 202 is a substrate, then solder balls 212 used for input/output are assembled to the back surface 203 of the substrate 202. The spacers 220 can be made of silicon having good heat dissipation, or dummy chips, for example. In addition, the spacers can also be made of metal which thermal expansion coefficient is the same as, or approximate to those of the first and the second dies 206, 208, avoiding thermal stress between the spacers 220 and the dies 206, 208.

Figure 5A:
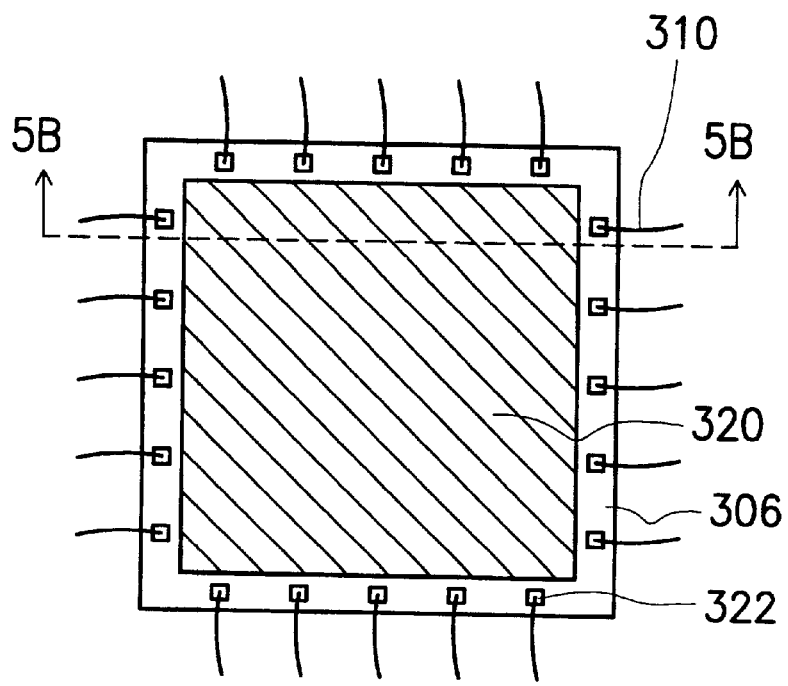
FIGS. 5A and 5B respectively show a top view and a cross-sectional view of a stacked-die package structure according to the second embodiment of the present invention.
Figure 5B:
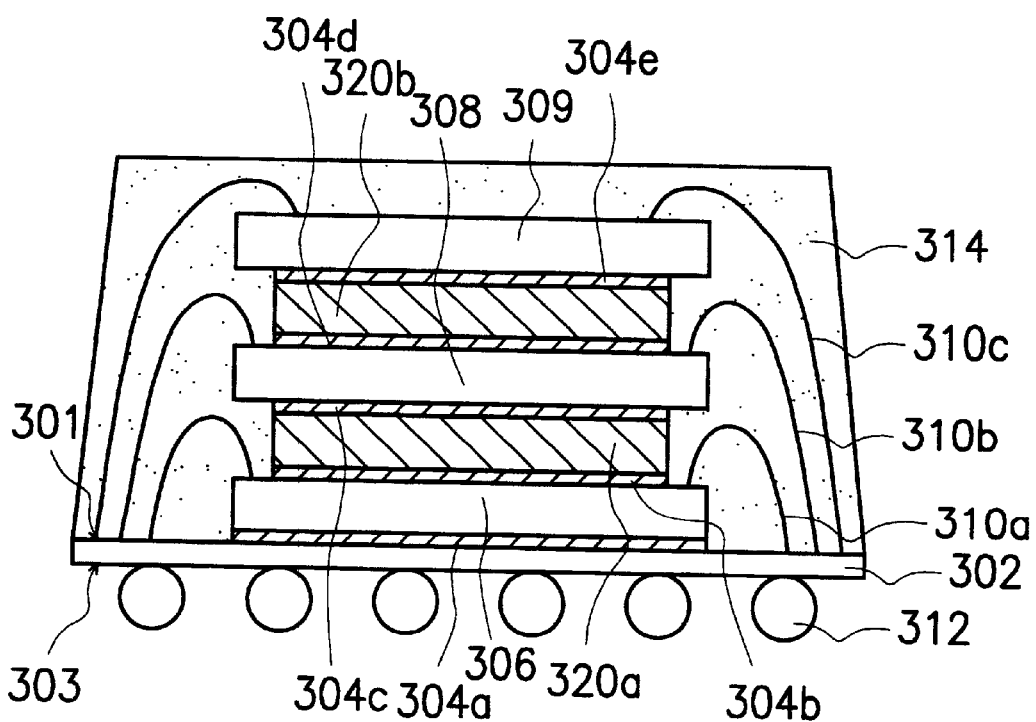

FIG. 5A shows a top view of a stacked-die package structure according to the second embodiment of the present invention, and FIG. 5B schematically shows a cross-sectional view of FIG. 5A along the line 5B—5B.

As shown in FIGS. 5A and 5B, a carrier 302 has an upper surface 301 and a back surface 303 opposite to the upper surface 301. The carrier 302 can be a substrate with solder balls 312 formed on the back surface 303, or a lead frame with pins (not shown). A number of dies are stacked one by one on the carrier 302. In the second embodiment, a first, a second and a third dies 306, 308, 309 are used as an example. The sizes of the first, the second and the third dies 306, 308 and 309 are approximate or the same. There are bonding pads 322 located around the peripheral sides of the first, the second and the third dies 306, 308 and 309 respectively. The first die 306 is stacked on the upper surface 301 with an adhesive layer 304a. The conducting lines 310a are respectively used for electrically connecting between the bonding pads 322 of the first die 306 and the carrier 302. Spacer 320a is stacked on the first die 306 with an adhesive layer 304b, and the second die 308 is then stacked on the spacer 320a with an adhesive layer 304c. The conducting lines 310b are respectively used for electrically connecting between the bonding pads of the second die 308 and the carrier 302. Spacer 320b is stacked on the second die 308 with an adhesive layer 304d, and the third die 309 is then stacked on the spacer 320b with an adhesive layers 304e. The conducting lines 310c are respectively used for electrically connecting between the bonding pads of the third die 309 and the carrier 302.

The spacers 320a, 320b can be a plate or a column shape. The adhesive layers 304a~304e are used for adhering the carrier 302, the dies 306, 308, 309, the spacers 320a, 320b therebetween. A mold compound 314 is formed over the upper surface 301 of the carrier 302 to encapsulate the spacers 320a, 320b, the dies 306, 308, 309, and the adhesive layers 304a~304e. If the carrier 302 is a substrate, then solder balls 312 used for input/output are assembled to the back surface 303 of the substrate 302.

In the second embodiment, three dies 306, 308, 309 are encapsulated within one package. Therefore, a number of dies can be encapsulated within one package according to the present invention. The carrier can be a substrate with solder balls or a lead frame with pins.

Figure 6:
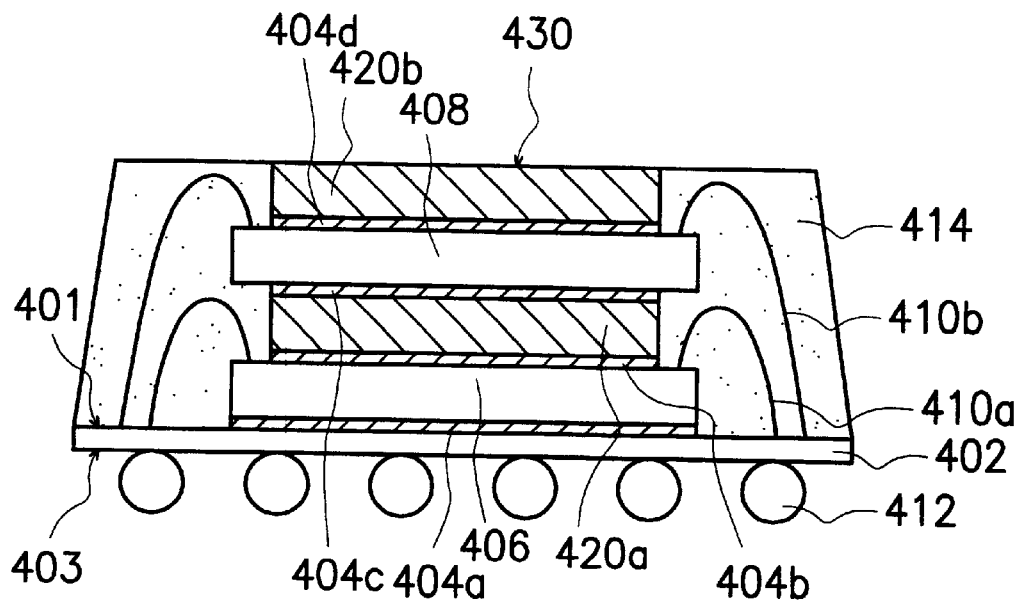
FIG. 6 schematically shows a cross-sectional view of a stacked-die package structure according to the third embodiment of the present invention.

FIG. 6 schematically shows a cross-sectional view of a stacked-die package structure according to the third embodiment of the present invention.

As shown in FIG. 6, a carrier 402 has an upper surface 401 and a back surface 403 opposite to the upper surface 401. A number of dies are stacked one by one on the carrier 402. In the third embodiment, a first and a second dies 406, 408 are used as an example. The sizes of the first and the second dies 406, 408 are approximate or the same. There are bonding pads located around the peripheral sides of the first and the second dies 406, 408 respectively. The first die 406 is stacked on the upper surface 401 with an adhesive layer 404a. The conducting lines 410a are respectively used for electrically connecting between the bonding pads of the first die 406 and the carrier 02. Spacer 420a is stacked on the first die 406 with adhesive layers 404b, and the second die 408 is then stacked on the spacer 420a with an adhesive layer 404c. The conducting lines 410b are respectively used for electrically connecting between the bonding pads of the second die 408 and the carrier 402. Spacer 420b is stacked on the second die 408 with an adhesive layer 404d. The spacer 420b has at least one heat dissipation surface 430. The spacers 420a, 420b can be a plate or a column shape. The adhesive layers 404a~404d are used for adhering the carrier 402, the dies 406, 408 and the spacers 420a, 420b therebetween.

A mold compound 414 is formed over the upper surface 401 of the carrier 402 to encapsulate the spacers 420a, 420b, the dies 406, 408 and the adhesive layers 404a~404d, but exposes the heat dissipation surface 430 of the spacer 420b for providing an excellent heat dissipation. If the carrier 402 is a substrate, then solder balls 412 used for input/output are assembled to the back surface 403 of the substrate 402. In addition, the carrier 402 can be also a lead frame with pins (not shown).

Figure 7:
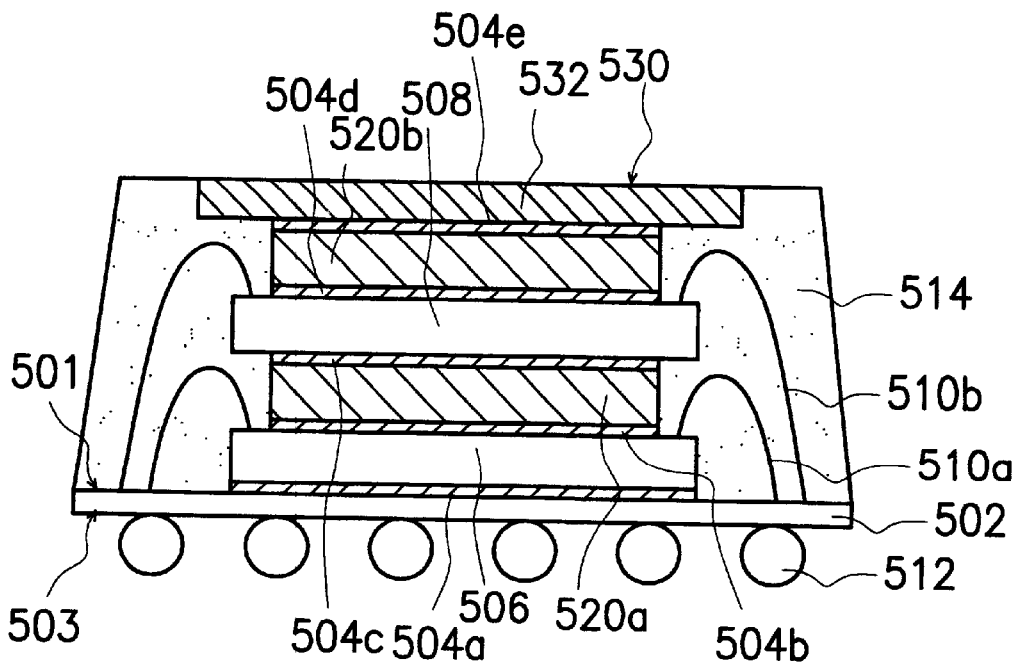
FIG. 7 schematically shows a cross-sectional view of a stacked-die package structure according to the fourth embodiment of the present invention.

FIG. 7 shows a cross-sectional view of a stacked-die package structure according to the fourth embodiment of the present invention.

As shown in FIG. 7, a carrier 502 has an upper surface 501 and a back surface 503 opposite to the upper surface 501. A number of dies are stacked one by one on the carrier 502. In the fourth embodiment, a first and a second dies 506, 508 are used as an example. The sizes of the first and the second dies 506, 508 are approximate or the same. There are bonding pads located around the peripheral sides of the first and the second dies 506, 508 respectively.

The first die 506 is stacked on the upper surface 501 with an adhesive layer 504a. The conducting lines 510a are respectively used for electrically connecting between the bonding pads of the first die 506 and the carrier 502. Spacer 520a is stacked on the first die 506 with an adhesive layers 504b, and the second die 508 is then stacked on the spacer 520a with an adhesive layers 504c. The conducting lines 510b are respectively used for electrically connecting between the bonding pads of the second die 508 and the carrier 502. Spacer 520b is stacked on the second die 508 with an adhesive layer 504d, and a heat dissipation plate 532 is then stacked on the spacer 520b with an adhesive layer 504e. The heat dissipation plate 532 has at least one heat dissipation surface 530. The spacers 520a, 520b can be a plate or a column shape. The adhesive layers 504a~504e are used for adhering the carrier 502, the dies 506, 508, the spacers 520a, 520b and the heat dissipation plate 532 therebetween.

A mold compound 514 is formed over the upper surface 501 of the carrier 502 to encapsulate the spacers 520a, 520b, the dies 506, 508, adhesive layers 504a~504e and the heat dissipation plate 532, but exposes the heat dissipation surface 530 of the heat dissipation plate 532 for providing excellent heat dissipation. If the carrier 502 is a substrate, then solder balls 512 used for input/output are assembled to the back surface 503 of the substrate 502. In addition, the carrier 402 can be also a lead frame with pins (not shown).

Figure 8:
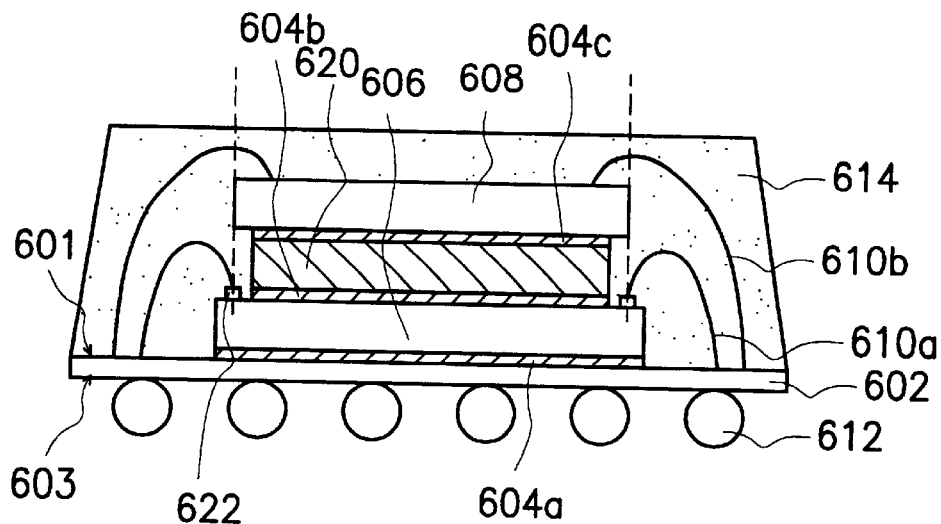
FIG. 8 schematically shows a cross-sectional view of a stacked-die package structure according to the fifth embodiment of the present invention.

FIG. 8 shows a cross-sectional view of a stacked-die package structure according to the fifth embodiment of the present invention.

As shown in FIG. 8, a carrier 602 has an upper surface 601 and a back surface 603 opposite to the upper surface 601. A number of dies are stacked one by one on the carrier 602. In the fifth embodiment, a first and a second 606, 608 are used as an example. The sizes of the first and the second dies 606, 608 are different. The first die 606 is larger than the second die 608. For example, the width difference of each side between the two dies 606, 608 is about 0.3 mm. The first die 606 is stacked on the upper surface 601 with an adhesive layer 604a. The conducting lines 610a are respectively used for electrically connecting between the bonding pads 622 of the first die 606 and the carrier 602. Spacer 620 is stacked on the first die 606 with an adhesive layer 604b, and the second die 608 is then stacked on the spacer 620 with an adhesive layer 604c. The conducting lines 610b are respectively used for electrically connecting between the bonding pads of the second die 608 and the carrier 602.

The spacers 620 can be a plate or a column shape. The adhesive layers 604a~604c are used for adhering the carrier 602, the dies 606, 608, and the spacer 620 therebetween. A mold compound 614 is formed over the upper surface 601 of the carrier 602 to encapsulate the spacers 620, the dies 606, 608, and the adhesive layers 604a~604c. If the carrier 602 is a substrate, then solder balls 612 are assembled to the back surface 603 of the substrate 602. In addition, the carrier 402 can be also a lead frame with pins (not shown).

Figure 9:
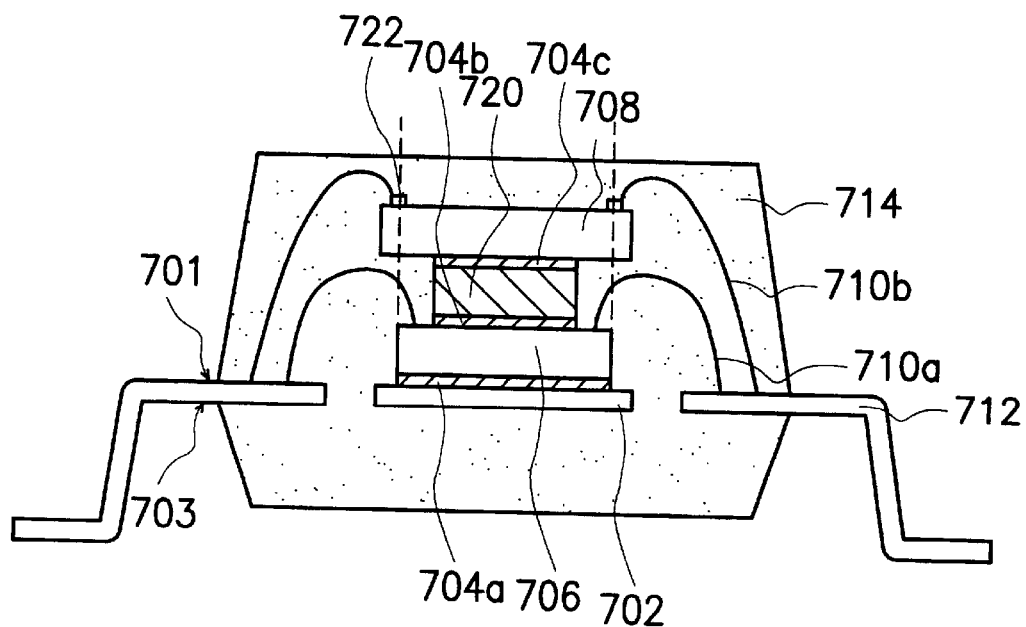
FIG. 9 schematically shows a cross-sectional view of a stacked-die package structure according to the sixth embodiment of the present invention.

FIG. 9 shows a cross-sectional view of a stacked-die package structure according to the sixth embodiment of the present invention.

As shown in FIG. 9, a lead frame 702 has an upper surface 701, a back surface 703 opposite to the upper surface 701, and a number of pins 712. A number of dies are stacked one by one on the lead frame 702. In the sixth embodiment, a first and a second dies 706, 708 are used as an example. The sizes of the first and the second dies 706, 708 are slightly different, and for example, the first die 706 is smaller than the second die 708. There are bonding pads located around the peripheral sides of the first and the second dies 706, 708. The first die 706 is stacked on the upper surface 701 with an adhesive layer 704a. The conducting lines 710a are respectively used for electrically connecting between the bonding pads of the first die 706 and the lead frame 702. Spacer 720 is stacked on the first die 706 with an adhesive layer 704b, and the second die 708 is then stacked on the spacer 720 with an adhesive layer 704c. The conducting lines 710b are respectively used for electrically connecting between the bonding pads 722 of the second die 708 and the lead frame 702.

The spacer 720 can be a plate or a column shape and the adhesive layers 704a~704c are used for adhering the lead frame 702, the dies 706, 708 and the spacer 720 therebetween. A mold compound 714 is formed over the upper surface 701 of the lead frame 702 to encapsulate the spacer 720, the dies 706, 708 and the adhesive layers 704a~704c. Similarly, a substrate with solder balls can be used for replacing the lead frame.

According to the present invention, the material of the adhesive layers can be silver paste, or paste with thermal conductivity and non-electrical conductivity. Therefore, the adhesive process is not necessary to be performed under a temperature above 400° C., simplifying the manufacturing process and avoiding crack of the first and the second dies during the adhesive process under high temperature.

In addition, the stacked-die package structure of the present invention can also avoid cushion effect due to the insufficient rigidity of the second die when the wire bonding process for the conductive lines is performed using supersonic, and therefore increases the yields.

The spacers of the stacked-die package structure of the present invention can be a plate or a column shape, for elevating dies. Therefore, the dies having an approximate size can be stacked without affecting the wire bonding process.

The stacked-die package structure of the present invention can provide an excellent heat dissipation property. The material of the spacers has good thermal conductivity and its thermal expansion coefficient is approximate to that of the dies for reducing thermal stress. By exposing the surface of the spacer or adding a thermal dissipation plate to increasing heat dissipation surface, the heat dissipation property further increases.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stacked-die package structure, comprising:
   a carrier having an upper surface and a back surface opposite to the upper surface;
   a plurality of dies stacked one by one on the upper surface of the carrier, and a plurality of bonding pads located on a top surface of each die along the periphery of each die;
   at least one spacer located between two adjacent dies, wherein a top surface and a bottom surface of the spacer face the two adjacent dies, respectively, and the spacer is made of material having a thermal expansion coefficient approximate to the thermal expansion coefficient of the dies;
   a plurality of adhesive layers located between the spacers, the dies, the carrier, wherein at least along a periphery of the top surface, a bottom surface or both surfaces of each die, and a side surface of the spacer are not covered by the adhesive layers;
   a plurality of conducting lines respectively electrically connecting the bonding pads to the carrier; and
   a mold compound formed over the upper surface of the carrier, for encapsulating the spacers, the dies and the adhesive layers.

2. The stacked-die package structure of claim 1, wherein the carrier is a substrate and a plurality of solder balls are formed on a back surface of the substrate.

3. The stacked-die package structure of claim 1, wherein the carrier is a lead frame having a plurality of pins.

4. The stacked-die package structure of claim 1, wherein the dies are equal in size.

5. The stacked-die package structure of claim 1, wherein a difference of each side of the two adjacent dies is about 0.3 mm.

6. The stacked-die package structure of claim 1, wherein the spacer is made of silicon.

7. The stacked-die package structure of claim 1, wherein the spacer is a dummy chip.

8. The stacked-die package structure of claim 1, wherein the spacer is made of metal having a thermal expansion coefficient approximate to the thermal expansion coefficient of the dies.

9. The stacked-die package structure of claim 1, wherein the spacer has a plate shape.

10. The stacked-die package structure of claim 1, wherein the spacer has a column shape.

11. The stacked-die package structure of claim 1, wherein the adhesive layers comprise silver paste.

12. The stacked-die package structure of claim 1, wherein the adhesive layers comprise paste materials with thermal conductivity and non-electrical conductivity.

13. The stacked-die package structure of claim 1, wherein the mold compound is epoxy.

14. A stacked-die package structure, comprising:
   a carrier having an upper surface and a back surface opposite to the upper surface;
   a plurality of dies stacked one by one on the upper surface of the carrier, and a plurality of bonding pads located on a top surface of each die along the periphery of each die, wherein a thermal dissipation plate is further arranged on one of the dies;
   a plurality of spacers located at four corners between two adjacent dies, wherein the spacer is made of material having a thermal expansion coefficient approximate to the thermal expansion coefficient of the dies;
   a plurality of adhesive layers located between the spacers, the dies, the carrier;
   a plurality of conducting lines respectively electrically connecting the bonding pads to the carrier; and
   a mold compound formed over the upper surface of the carrier, for encapsulating the spacers, the dies and the adhesive layers and exposing the heat dissipation surface.

15. The stacked-die package structure of claim 14, wherein the carrier is a substrate and a plurality of solder balls are formed on a back surface of the substrate.

16. The stacked-die package structure of claim 14, wherein the carrier is a lead frame having a plurality of pins.

17. The stacked-die package structure of claim 14, wherein the dies are equal in size.

18. The stacked-die package structure of claim 14, wherein a difference of each side of the two adjacent dies is about 0.3 mm.

19. The stacked-die package structure of claim 14, wherein the spacers comprise materials made of silicon.

20. The stacked-die package structure of claim 14, wherein the spacers comprise dummy chips.

21. The stacked-die package structure of claim 14, wherein the spacers comprise materials made of metal having a thermal expansion coefficient approximate to the thermal expansion coefficient of the dies.

22. The stacked-die package structure of claim 14, wherein each of the spacer is a plate shape.

23. The stacked-die package structure of claim 14, wherein each of the spacers is a column shape.

24. The stacked-die package structure of claim 14, wherein the adhesive layers comprise silver paste.

25. The stacked-die package structure of claim 14, wherein the adhesive layers comprise paste materials with thermal conductivity and non-electrical conductivity.

26. The stacked-die package structure of claim 14, wherein the mold compound is epoxy.

* * * * *